United States Patent
Okano et al.

(10) Patent No.: US 11,289,129 B2
(45) Date of Patent: Mar. 29, 2022

(54) ELECTRONIC DEVICE, STORAGE DEVICE, AND DISK DEVICE

(71) Applicants: Kabushiki Kaisha Toshiba, Tokyo (JP); Toshiba Electronic Devices & Storage Corporation, Tokyo (JP)

(72) Inventors: Taichi Okano, Tokyo (JP); Nobuhiro Yamamoto, Yokohama Kanagawa (JP); Kota Tokuda, Kawasaki Kanagawa (JP); Jia Liu, Yokohama Kanagawa (JP); Masahide Takazawa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/007,652

(22) Filed: Aug. 31, 2020

(65) Prior Publication Data

US 2021/0225412 A1 Jul. 22, 2021

(30) Foreign Application Priority Data

Jan. 22, 2020 (JP) .............................. JP2020-008442

(51) Int. Cl.
- *G06F 13/10* (2006.01)
- *G11B 33/12* (2006.01)
- *G06F 13/16* (2006.01)

(52) U.S. Cl.
CPC ........ *G11B 33/122* (2013.01); *G06F 13/1668* (2013.01); *G06F 2213/0032* (2013.01)

(58) Field of Classification Search
CPC ......... G06F 13/1668; G06F 2213/0032; G11B 33/122
See application file for complete search history.

(56) References Cited

U.S. PATENT DOCUMENTS

| | | | |
|---|---|---|---|
| 5,936,841 A | 8/1999 | Kantner et al. | |
| 9,178,504 B2* | 11/2015 | Komori | H03K 7/02 |
| 9,337,919 B2 | 5/2016 | Kikuchi et al. | |
| 9,886,985 B1* | 2/2018 | Okamoto | G11B 33/027 |
| 10,511,349 B2* | 12/2019 | Kahlman | H04B 5/0056 |
| 2003/0112585 A1* | 6/2003 | Silvester | G06F 1/1626 361/679.41 |
| 2015/0085903 A1* | 3/2015 | Gundel | H05K 1/18 375/219 |

FOREIGN PATENT DOCUMENTS

| | | |
|---|---|---|
| JP | 2005-011458 A | 1/2005 |
| JP | 11-509353 | 8/2011 |
| JP | 5729430 B2 | 6/2015 |

* cited by examiner

Primary Examiner — Cheng Yuan Tseng
(74) Attorney, Agent, or Firm — Allen & Overy LLP

(57) ABSTRACT

An electronic device according to one embodiment includes a housing, a first substrate, a second substrate, a first wireless communication device and a second wireless communication device. The first substrate is located inside the housing. The second substrate is located outside the housing and attached to the housing. The first wireless communication device is included in the first substrate. The second wireless communication device is included in the second substrate and wirelessly communicates with the first wireless communication device.

13 Claims, 11 Drawing Sheets

ELECTRONIC DEVICE, STORAGE DEVICE, AND DISK DEVICE

CROSS-REFERENCE TO RELATED APPLICATIONS

This application is based upon and claims the benefit of priority from Japanese Patent Application No. 2020-008442, filed on Jan. 22, 2020; the entire contents of which are incorporated herein by reference.

FIELD

Embodiments described herein relate generally to an electronic device, a storage device, and a disk device.

BACKGROUND

Electronic devices have been known, which include two substrates one each inside and outside the housing to perform data communication between the two substrates. For example, the housing is equipped with a connector that electrically connects between the two substrates. The two substrates can perform wired communication through the connector.

To communicate a large amount of data between the two substrates, increasing the number of wires or pins in the connector can improve a communication speed between the two substrates. The increase in the number of wires or pins in the connector may, however, lead to increasing the connector in size.

DETAILED DESCRIPTION

An electronic device according to one embodiment includes a housing, a first substrate, a second substrate, a first wireless communication device and a second wireless communication device. The first substrate is located inside the housing. The second substrate is located outside the housing and attached to the housing. The first wireless communication device is included in the first substrate. The second wireless communication device is included in the second substrate and wirelessly communicates with the first wireless communication device.

First Embodiment

A first embodiment will be described below with reference to FIGS. 1 to 7. In this specification, components according to the embodiment and a description of the components may be described by a plurality of expressions. The components and the description thereof are one example, and are not limited by the expressions in this specification. Components may also be specified by different names than those in this specification. In addition, the components may be described even by the expressions different from those in this specification.

Figure 1:
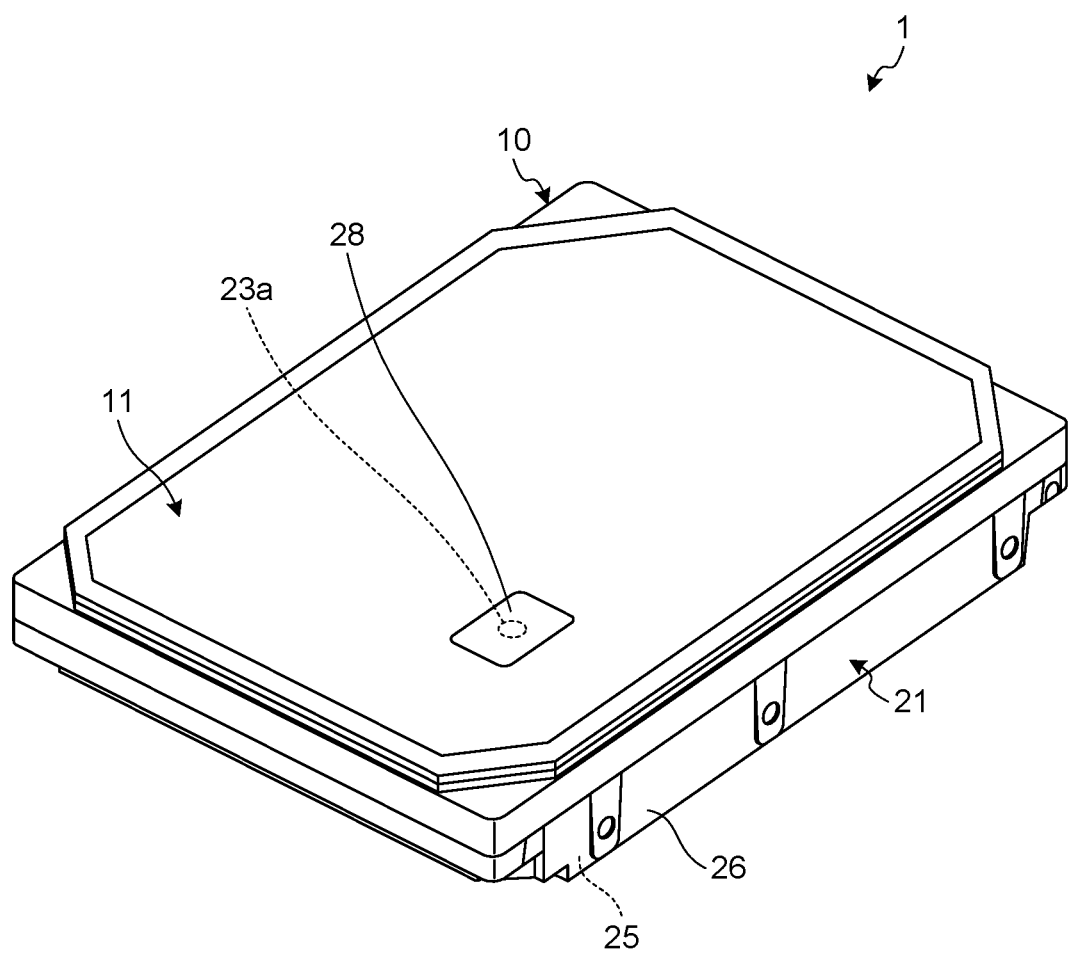
FIG. 1 is an exemplary perspective view illustrating a hard disk drive (HDD) according to a first embodiment.

FIG. 1 is an exemplary perspective view illustrating a hard disk drive (HDD) 10 according to a first embodiment. The HDD 10 is mounted on, for example, a host computer 1 and constitutes a part of the host computer 1. The HDD 10 is an example of an electronic device, a storage device, and a disk device, and may also be called an external storage device or a magnetic disk device. The host computer 1 is an example of an external device.

The electronic device and the storage device may be other devices such as a solid state drive (SSD). The host computer 1 can be any of various computers such as a personal computer, a super computer, a server, a television receiver, or a game machine. The external device may be another device such as an external hard drive.

Figure 2:
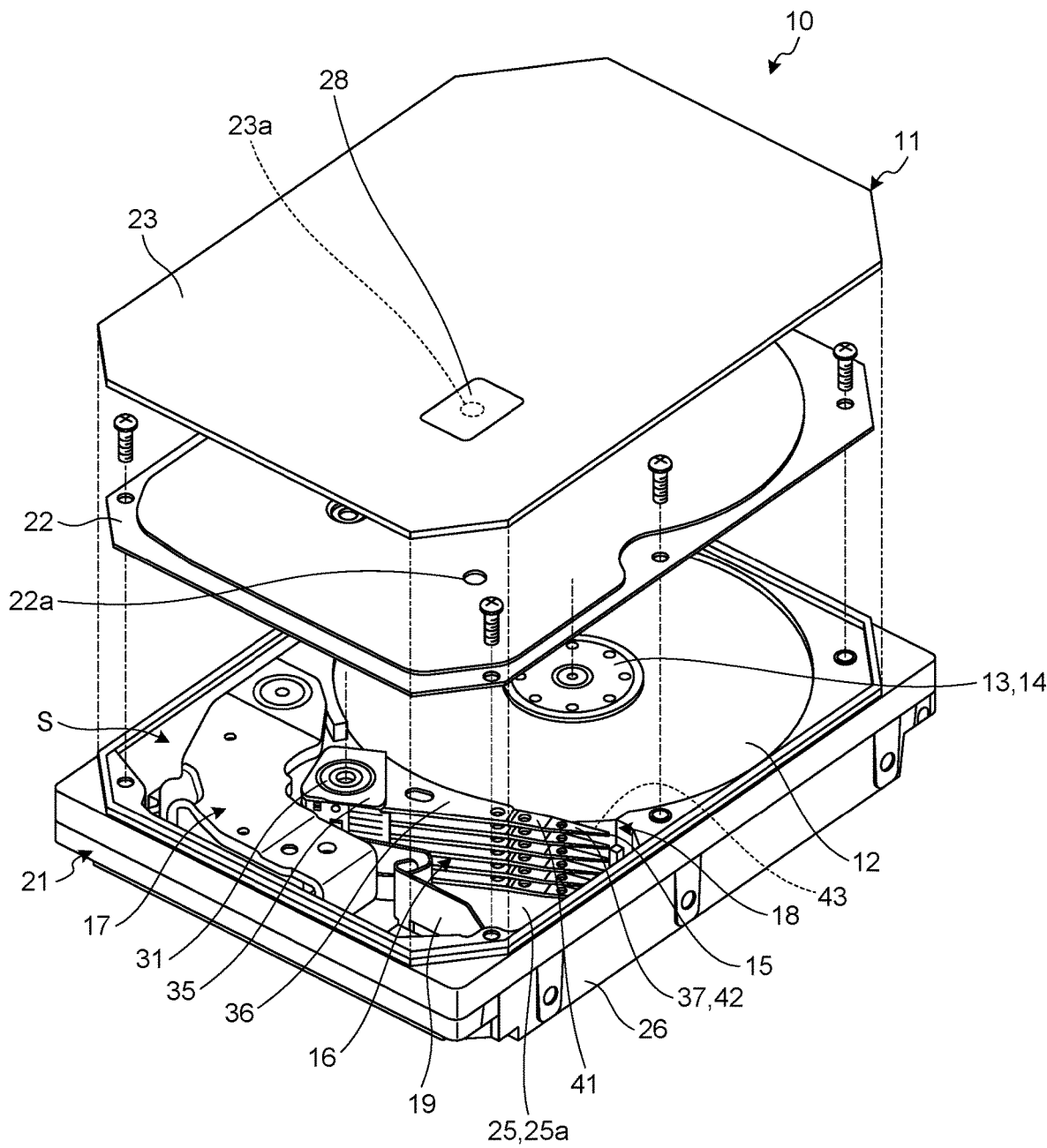
FIG. 2 is an exemplary exploded perspective view illustrating an HDD according to the first embodiment.

FIG. 2 is an exemplary exploded perspective view illustrating the HDD 10 according to the first embodiment. As illustrated in FIG. 2, the HDD 10 includes a housing 11, a plurality of magnetic disks 12, a spindle motor 13, a clamp spring 14, a plurality of magnetic heads 15, an actuator assembly 16, a voice coil motor (VCM) 17, a ramp load mechanism 18, and a flexible printed circuit board (FPC) 19. The magnetic disk 12 is an example of a recording medium. The FPC 19 is an example of a first substrate. The first substrate may be a rigid substrate.

The housing 11 includes a base 21, an inner cover 22, and an outer cover 23. The base 21 is a bottomed container and has a bottom wall 25 and sidewalls 26. The bottom wall 25 has a substantially rectangular (quadrangular) plate shape. The sidewalls 26 protrude from the bottom wall 25. The bottom wall 25 and the sidewalls 26 are formed of, for example, a metal material such as an aluminum alloy in a unified manner.

The inner cover 22 and the outer cover 23 are made of, for example, a metal material such as an aluminum alloy. The inner cover 22 is attached to an end of the sidewalls 26 with, for example, screws. The outer cover 23 covers the inner cover 22 and is hermetically fixed to the end of the sidewalls 26 by, for example, welding.

The housing 11 has a space S inside. The space S is, for example, hermetically or liquid-tightly sealed. The space S is formed, defined, or partitioned by the base 21 and the inner cover 22. The magnetic disk 12, the spindle motor 13, the clamp spring 14, the magnetic head 15, the actuator assembly 16, the voice coil motor 17, the ramp load mechanism 18, and the FPC 19 are arranged in the internal space S of the housing 11.

The inner cover 22 is provided with a vent hole 22a. The outer cover 23 is provided with a vent hole 23a. Air is evacuated through the vent holes 22a and 23a from inside the housing 11 with the components attached to the inside of the base 21 and the inner cover 22 and the outer cover 23 attached to the base 21. In addition, the internal space S of the housing 11 is filled with a gas different from air.

Examples of gas filling the space S include a low density gas having a lower density than air, an inert gas having low reactvity, or the like. For example, the space S is filled with helium. The space S may be filled with other fluids. Further, the internal space S of the housing 11 may be maintained at a vacuum, a low pressure close to the vacuum, or a negative pressure lower than an atmospheric pressure.

The vent hole 23a of the outer cover 23 is closed by a seal 28. The seal 28 is made of, for example, metal or a synthetic resin. The seal 28 hermetically seals the vent hole 23a to prevent the fluid filling the space S from leaking from the vent hole 23a.

The magnetic disk 12 includes, for example, a magnetic recording layer on at least one of the upper surface and the lower surface thereof. A diameter of the magnetic disk 12 is, for example, set to 3.5 inches, but is not limited to this example.

The spindle motor 13 supports and rotates the plurality of magnetic disks 12 placed on the top of each other at intervals. The clamp spring 14 holds the plurality of magnetic disks 12 on a hub of the spindle motor 13.

Each magnetic head 15 records and reproduces information on the recording layer of the magnetic disk 12. In other words, the magnetic head 15 reads and writes information from and to the magnetic disk 12. The magnetic head 15 is supported by the actuator assembly 16.

The actuator assembly 16 is rotatably supported by a support shaft 31 spaced away from the magnetic disk 12. The voice coil motor 17 rotates and places the actuator assembly 16 at a desired position. When the magnetic head 15 moves to the outermost circumference of the magnetic disk 12 due to the rotation of the actuator assembly 16 by the voice coil motor 17, the ramp load mechanism 18 holds the magnetic head 15 at an unload position apart from the magnetic disk 12.

The actuator assembly 16 includes an actuator block 35, a plurality of arms 36, and a plurality of head suspension assemblies 37. The head suspension assembly 37 may also be referred to as a head gimbal assembly (HGA).

The actuator block 35 is rotatably supported by the support shaft 31 via, for example, a bearing. The arms 36 protrude from the actuator block 35 in a direction substantially orthogonal to the support shaft 31. The actuator assembly 16 may be divided, and the arms 36 may protrude from the corresponding actuator blocks 35.

The arms 36 are arranged at intervals in the extending direction of the support shaft 31. Each arm 36 has a plate shape to be able to enter the space between the adjacent magnetic disks 12. The arms 36 extend substantially in parallel.

The actuator block 35 and the arms 36 are formed of aluminum in a unified manner, for example. The material of the actuator block 35 and the arms 36 is not limited to this example.

The actuator block 35 is provided with a protrusion on which a voice coil of the voice coil motor 17 is set. The voice coil motor 17 includes a pair of yokes, a voice coil located between the yokes, and a magnet placed on the yokes.

The head suspension assemblies 37 are attached to the tips of the corresponding arms 36, protruding from the arms 36. Thus, the head suspension assemblies 37 are arranged at intervals in the extending direction of the support shaft 31.

Each of the head suspension assemblies 37 includes a base plate 41, a load beam 42, and a flexure 43. The magnetic heads 15 are attached to the corresponding head suspension assemblies 37.

The base plate 41 and the load beam 42 are made of stainless steel, for example. The material of the base plate 41 and the load beam 42 are not limited to this example. The base plate 41 is attached to the tip of the arm 36. The load beam 42 has a plate shape thinner in thickness than the base plate 41. The load beam. 42 is attached to a tip of the base plate 41 and protrudes from the base plate 41.

The flexure 43 has an elongated strip shape. The shape of the flexure 43 is not limited to this example.

The flexure 43 is a laminated plate including a metal plate (lining layer) such as stainless steel, an insulating layer formed on the metal plate, a conductive layer forming a plurality of wires (wiring patterns) on the insulating layer, and a protective layer (insulating layer) covering the conductive layer.

The flexure 43 is provided at one end with a displaceable gimbal (elastic support) located on the load beam 42. The magnetic head 15 is mounted on the gimbal. The other end of the flexure 43 is connected to the FPC 19. As a result, the FPC 19 is electrically connected to the magnetic head 15 via the wiring of the flexure 43.

Figure 3:
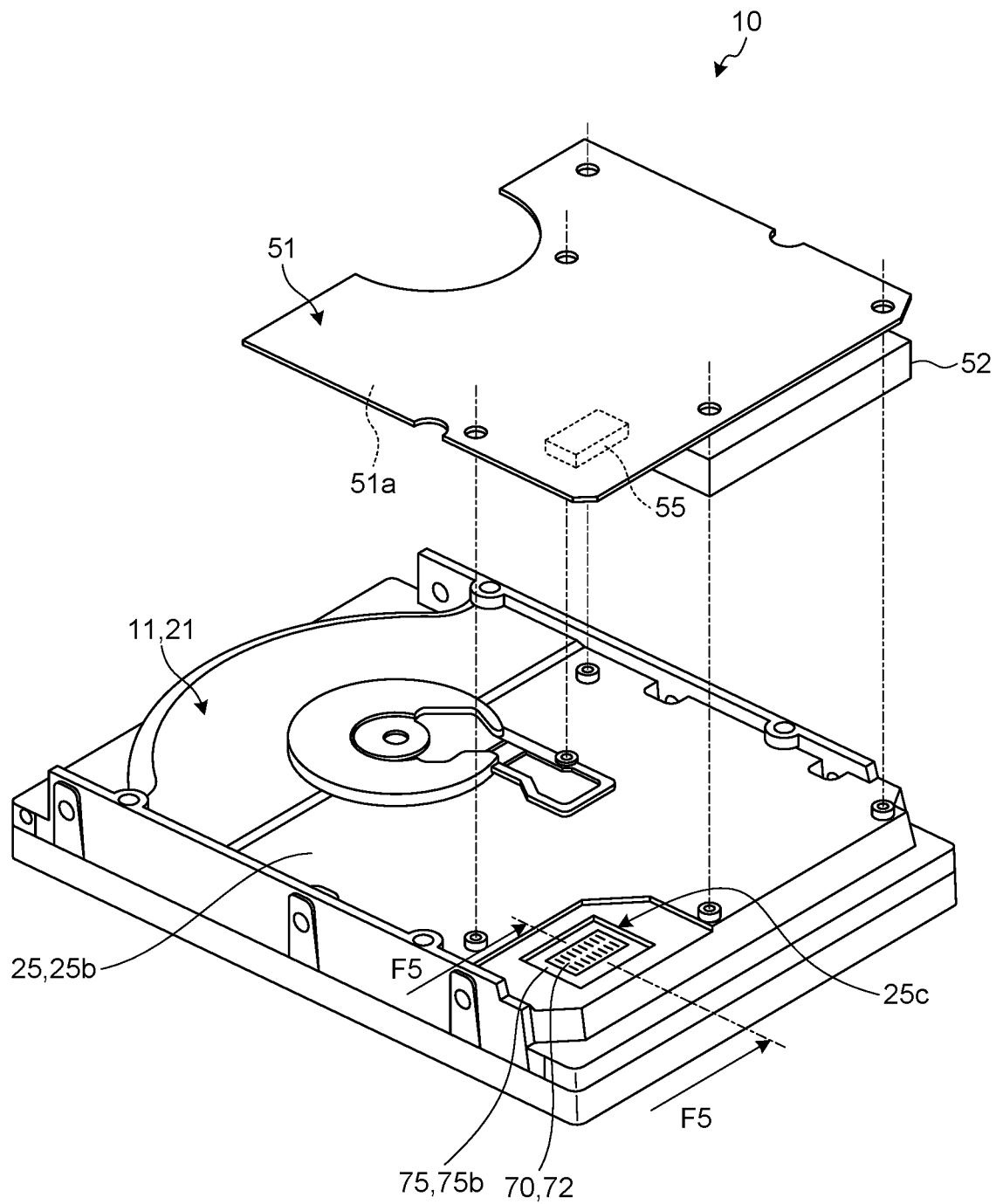
FIG. 3 is an exemplary exploded perspective view of the HDD according to the first embodiment, as seen in a different direction from FIG. 2.

FIG. 3 is an exemplary exploded perspective view of the HDD 10 according to the first embodiment, as seen in a different direction from FIG. 2. As illustrated in FIG. 3, the printed circuit board (PCB) 51 is attached to the outside of the bottom wall 25 of the base 21. In other words, the PCB 51 is set outside the housing 11. The PCB 51 is attached to the bottom wall 25 by screwing with screws or snap fitting with hooks, for example.

The PCB 51 is, for example, a rigid substrate such as a glass epoxy substrate, a multilayer substrate, or a build-up substrate. The PCB 51 is an example of a second substrate. The second substrate may be another substrate such as an FPC.

Figure 4:
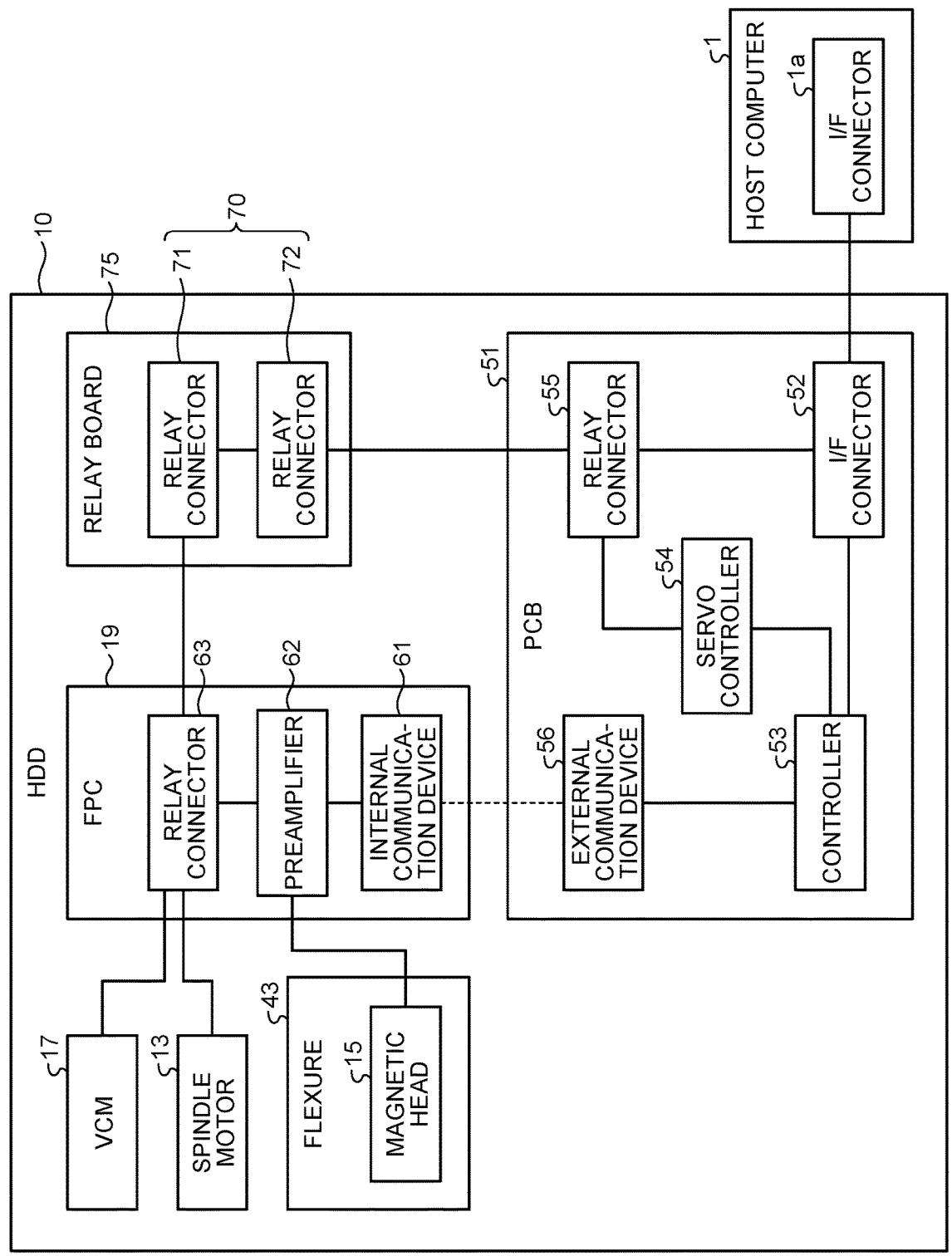
FIG. 4 is an exemplary block diagram illustrating a configuration of the HDD according to the first embodiment.

FIG. 4 is a block diagram illustrating arm exemplary configuration of the HDD 10 according to the first embodiment. As illustrated in FIG. 4, the PCB 51 is equipped with an interface (I/F) connector 52, a controller 53, a servo controller 54, a relay connector 55, and an external communication device 56. The I/F connector 52 is an example of an external connector. The external communication device 56 is an example of a second communication device. The PCB 51 is further equipped with various memories such as RAM, ROM, and a buffer memory, a coil, a capacitor, and other electronic components.

The I/F connector 52 conforms to an interface standard such as serial ATA, and is connected to an I/F connector 1a of the host computer 1. The HDD 10 is supplied with power from the host computer 1 through the I/F connector 52, and receives access commands (control signal) such as a write command and a read command and various kinds of data. Further, the HDD 10 transmits various kinds of data to the host computer 1 through the I/F connector 52. In this way, the PCB 51 performs wired communication with the host computer 1 through the I/F connector 52. The HDD 10 may be wirelessly communicable with the host computer 1.

The controller 53 includes, for example, a read/write channel (RWC), a hard disk controller (HDC), and a processor. The controller 53 may be one component, or may be a generic term for separate RWC, HDC, and processor. The controller 53 serves to control the HDD 10 as a whole.

The servo controller 54 drives the spindle motor 13 and the VCM 17. The relay connector 55 is, for example, used to supply power to various parts and components arranged inside the housing 11. The external communication device 56 transmits and receives data to and from the components mounted on the FPC 19.

An internal communication device 61, a preamplifier 62, and a relay connector 63 are mounted on the FPC 19. The internal communication device 61 is an example of a first wireless communication device. The internal communication device 61 wirelessly communicates with the external communication device 56.

The preamplifier 62 is electrically connected to the magnetic head 15. At data read, the preamplifier 62 amplifies the signal read by the magnetic head 15 from the magnetic disk 12 for output. The internal communication device 61 supplies the signal to the RWC of the controller 53 through the external communication device 56. Further, the preamplifier 62 receives and amplifies a signal corresponding to write data from the RWC of the controller 53 through the external communication device 56 and the internal communication device 61. The preamplifier 62 supplies the signal to the magnetic head 15.

The relay connector 63 receives power supply via the relay connector 55 of the PCB 51. The magnetic head 15 and the internal communication device 61 and the preamplifier 62 of the FPC 19 operate by the power supplied via the relay connector 63.

In the controller 53 of the PCB 51, the HDC functions to control, for example, data transmission and reception to and from the host computer 1 through the I/F connector 52, controls a buffer memory, and correct error in read data.

The RWC of the controller 53 receives and modulates the write data from the HDC, and supplies the modulated data to the preamplifier 62 via the external communication device 56 and the internal communication device 61, for example. Further, the RWC receives the signal read from the magnetic disk 12 from the preamplifier 62 through the external communication device 56 and the internal communication device 61 and demodulates the signal to digital data for output to the HDC.

The processor of the controller 53 is, for example, a central processing unit (CPU). The processor serves to control the HDD 10 as a whole according to, for example, firmware pre-stored in the ROM and the magnetic disk 12. For example, the processor loads the firmware from the ROM and the magnetic disk 12 into the RAM, and controls the magnetic head 15, the servo controller 54, the external communication device 56, the internal communication device 61, the preamplifier 62, the RWC, the HDC, and other components by the loaded firmware.

The HDD 10 further includes a wired connection 70. The wired connection 70 is an example of a connection. The wired connection 70 includes two relay connectors 71 and 72. The relay connector 71 is an example of a first connector. The relay connector 72 is an example of a second connector. The relay connectors 71 and 72 are electrically connected to each other.

The relay connectors 71 and 72 are mounted on a relay board 75 attached to the base 21. The relay board 75 is an example of a wall and is a part of the housing 11. In other words, the housing 11 includes the relay board 75.

The relay connector 71 is connected to the relay connector 63 of the FPC 19. The relay connector 72 is connected to the relay connector 55 of the PCB 51. As a result, the relay connector 55 of the PCB 51 is electrically connected to the relay connector 63 of the FPC 19 through the relay connectors 71 and 72. That is, the wired connection 70 electrically connects the FPC 19 and the PCB 51.

The FPC 19, the internal communication device 61 and the preamplifier 62 mounted on the FPC 19, and the magnetic head 15 mounted on the flexure 43 receive power supply from the host computer 1 through the relay connectors 55, 63, 71, and 72 and the I/F connector 52. In other words, the FPC 19 is supplied with power from the PCB 51 via the wired connection 70.

The relay connectors 55, 63, 71, and 72 are equipped with a plurality of pins and wiring for the purpose of power supply and grounding. Further, the relay connectors 55, 63, 71, and 72 are equipped with a plurality of pins and wiring for power supply, grounding, and controlling the spindle motor 13 and the VCM 17.

As described above, the relay connectors 55, 63, 71, and 72 according to the present embodiment are used to supply power to the various components arranged in the internal space S of the housing 11. The relay connectors 55, 63, 71, and 72 may be provided with pins and wiring for data communication between the components mounted on the FPC 19 and the components mounted on the PCB 51.

Figure 5:
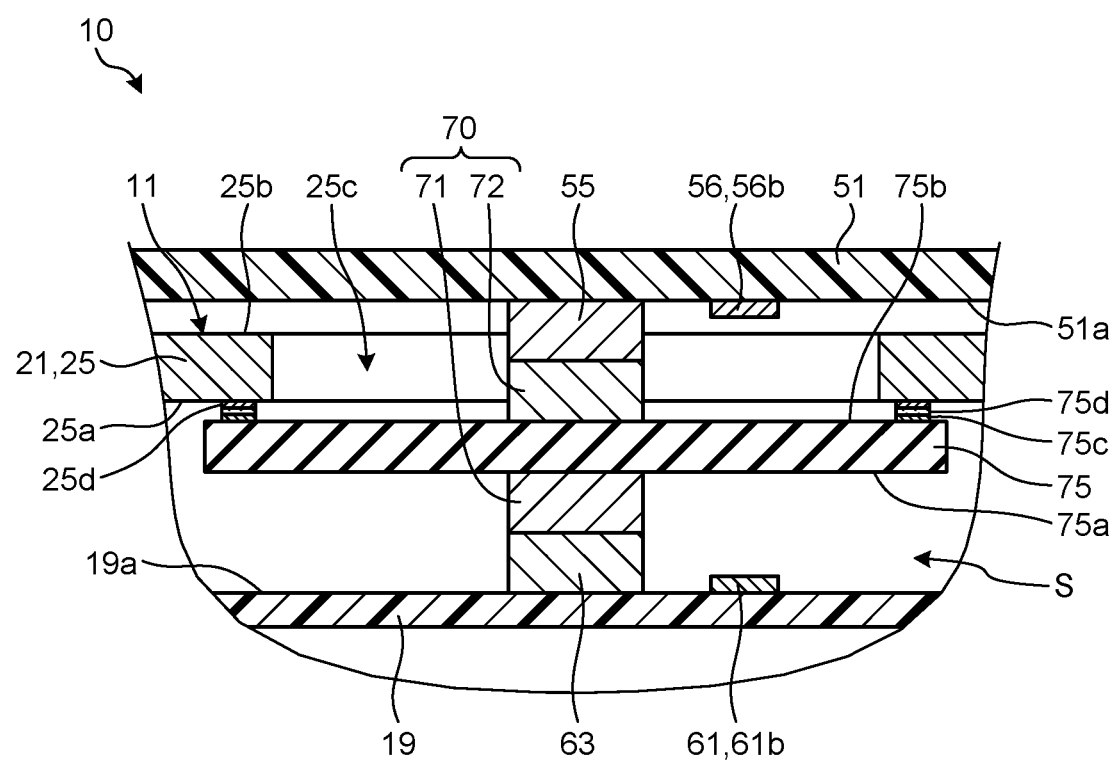
FIG. 5 is an exemplary cross-sectional view illustrating a part of the HDD according to the first embodiment taken along the line F5-F5 of FIG. 3.

Hereinafter, the structure of the HDD 10 according to the present embodiment will be described in detail. FIG. 5 is an exemplary cross-sectional view illustrating a part of the HDD 10 according to the first embodiment taken along the line F5-F5 of FIG. 3. As illustrated in FIG. 5, the bottom wall 25 of the base 21 has an inner surface 25a and an outer surface 25b.

The inner surface 25a is substantially flat facing the inside of the housing 11. The inner surface 25a forms, defines, or partitions a part of the internal space S of the housing 11. The inner surface 25a faces the components such as the FPC 19 arranged in the space S at intervals.

The outer surface 25b is opposite the inner surface 25a and is substantially flat facing the outside of the housing 11. The outer surface 25b faces the PCB 51 with spacing. The outer surface 25b and the PCB 51 may contact with each other.

The bottom wall 25 is provided with an through hole 25c. The through hole 25c is an example of a hole. The through hole 25c is substantially rectangular and penetrates through the bottom wall 25 and opens to the inner surface 25a and the outer surface 25b. In other words, the through hole 25c allows the internal space S of the housing 11 to communicate with outside.

The relay board 75 is, for example, a substantially rectangular plate made of an insulator such as a synthetic resin or ceramics. In other words, the relay board 75 includes an insulator. Thus, radio waves can pass through the relay board 75. The relay board 75 may partially include a conductor such as a conductive layer. The relay board 75 has an inner surface 75a and an outer surface 75b.

The inner surface 75a is substantially flat facing the inside of the housing 11. The inner surface 75a forms, defines, or partitions a part of the internal space S of the housing 11. The inner surface 75a faces components such as the FPC 19 arranged in the space S at intervals.

The outer surface 75b is opposite the inner surface 75a and is substantially flat facing the outside of the housing 11. The area of the outer surface 75b is larger than the opening area (cross-sectional area) of the through hole 25c. The outer surface 75b covers the through hole 25c from the inside of the housing 11. A part of the outer surface 75b faces the inner surface 25a of the bottom wall 25. Another part of the outer surface 75b is exposed to the outside of the housing 11 through the through hole 25c and faces the PCB 51 with spacing.

The relay board 75 includes fixing part 75c. The fixing part 75c is, for example, a metal foil of a frame form. The fixing part 75c is located on the opposing part of the outer surface 75b with respect to the inner surface 25a of the bottom wall 25. In other words, the fixing part 75c is located between the outer surface 75b of the relay board 75 and the inner surface 25a of the bottom wall 25.

The fixing part 75c faces the fixing part 25d located on the inner surface 25a of the bottom wall 25. The fixing part. 25d is a metal foil having substantially the same size and shape as the fixing part 75c. The fixing part 25d and the fixing part 75c are fixed to each other with, for example, solder 75d. The solder 75d closes the entire space between the inner surface 25a of the bottom wall 25 and the outer surface 75b of the relay board 75. That is, the relay board 75 serves to hermetically or liquid-tightly close the through hole 25c. The relay board 75 may be fixed to the bottom wall 25 by other means such as an adhesive.

Each of the relay connectors 71 and 72 includes, for example, an insulating base and a plurality of pins (terminals) set on the base. The number of pins and the sizes of the relay connectors 71 and 72 are set depending on, for example, the amount of power and the amount of data transmitted through the wired connection 70.

in the present embodiment, the wired connection 70 is used for supplying power but not for transmitting data, which results in reducing the number of pins and the size of the relay connectors 71, 72. The wired connection 70 may be used for data transmission.

For example, one end of the pins of the relay connector 71 is soldered to an electrode set on the inner surface 75a of the relay board 75. Thereby, the relay connector 71 is attached to the relay board 75. In this way, the relay connector 71 is set on the relay board 75, protruding from the inner surface 75a.

For example, one end of the pins of the relay connector 72 is soldered to an electrode set on the outer surface 75b of the relay board 75. Thereby, the relay connector 72 is attached to the relay board 75. In this way, the relay connector 72 is set on the relay board 75, protruding from the outer surface 75b. That is, the wired connection 70 is set on the relay board 75.

In the relay board 75, the electrode located on the inner surface 75a and the electrode located on the outer surface 75b are electrically connected to each other through a conductor such as a via penetrating through the relay board 75. As a result, the relay connector 71 and the relay connector 72 are electrically connected to each other. The conductor serves to electrically connect the electrode on the inner surface 75a and the electrode on the outer surface 75b while the relay board 75 maintains the hermiticity of the through hole 25c.

The FPC 19 includes, for example, a lamination of a conductor layer, an insulating layer, and an adhesive layer, and is elastically deformable. The conductor layer is made of a conductive metal such as copper. The insulating layer is made of an insulating synthetic resin such as polyimide. The FPC 19 has an outer surface 19a. The outer surface 19a faces the inner surface 75a of the relay board 75 with spacing.

The PCB 51 has an inner surface 51a. The inner surface 51a faces the outer surface 25b of the bottom wall 25 and the outer surface 75b of the relay board 75 at intervals. The area of the inner surface 51a is larger than the opening area (cross-sectional area) of the through hole 25c. The inner surface 51a covers the through hole 25c.

The relay connectors 55 and 63 of the PCB 51 and the FPC 19 have a structure corresponding to the relay connectors 71 and 72 of the wired connection 70. Each of the relay connectors 55 and 63 includes, for example, an insulating base and a plurality of pins (terminals) set on the base.

For example, one end of the pins of the relay connector 63 is soldered to an electrode set on the outer surface 19a of the FPC 19. Thereby, the relay connector 63 is attached to the FPC 19. In this way, the relay connector 63 is set on the FPC 19, protruding from the outer surface 19a. The relay connector 63 is connected to the relay connector 71 of the wired connection 70. As a result, the relay connector 71 is connected to the FPC 19.

For example, one end of the pins of the relay connector 55 is soldered to an electrode set Cr the inner surface 51a of the PCB 51. Thereby, the relay connector 55 is attached to the PCB 51. In this way, the relay connector 55 is set on the PCB 51 and protrudes from the inner surface 51a. The relay connector 55 is connected to the relay connector 72 of the wired connection 70. As a result, the relay connector 72 is connected to the PCB 51. The FPC 19 and the PCB 51 are electrically connected to each other through the wired connection 70 while the relay board 75 maintains the hermiticity of the through hole 25c.

Figure 6:
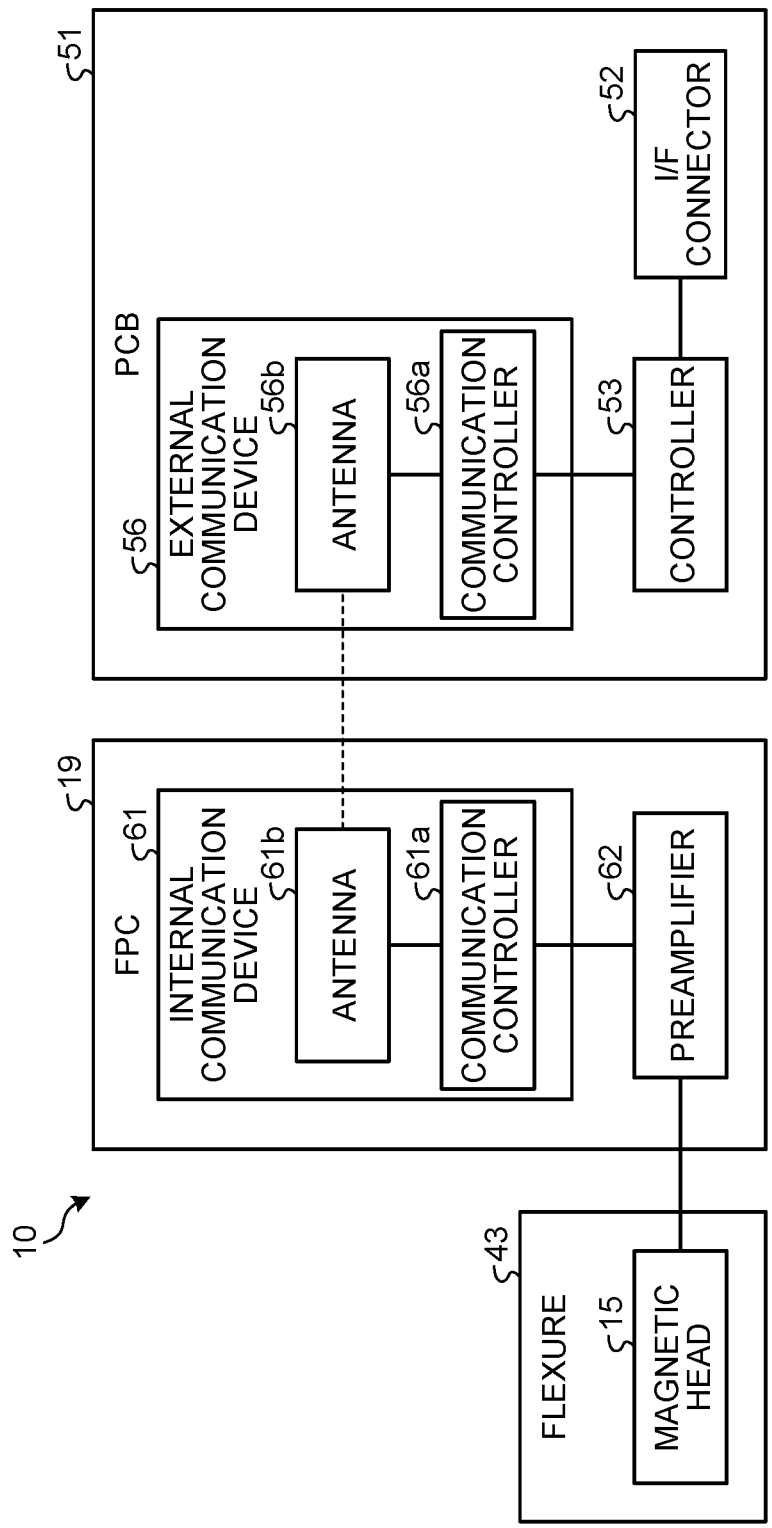
FIG. 6 is an exemplary block diagram illustrating a configuration of a part of the HDD according to the first embodiment.

FIG. 6 is a block diagram illustrating an exemplary configuration of a part of the HDD 10 according to the first embodiment. As illustrated in FIG. 6, in the present embodiment, the external communication device 56 mounted on the PCB 51 includes a communication controller 56a and an antenna 56b. The antenna 56b is an example of a second antenna.

The communication controller 56a represents, for example, an electronic component mounted on the PCB 51. The communication controller 56a may include an electronic component and a conductor pattern built in or mounted on the PCB 51.

The communication controller 56a converts, for example, a digital signal input from the controller 53 into an analog signal and outputs the analog signal from the antenna 56b as radio waves. Further, the communication controller 56a receives the analog signal through the antenna 56b, and converts the analog signal to a digital signal and outputs the digital signal to the controller 53.

As illustrated in FIG. 5, the antenna 56b according to the first embodiment is, for example, a chip antenna. The antenna 56b is mounted on the opposing part of the inner surface 51a of the PCB 51 with respect to the outer surface 75b of the relay board 75. The antenna 56b may be mounted at another position or may be united with the communication controller 56a.

As illustrated in FIG. 6, in the present embodiment, the internal communication device 61 mounted on the FPC 19 includes a communication controller 61a and an antenna 61b. The antenna 61b is an example of a first antenna.

The communication controller 61a represents, for example, an electronic component mounted on the FPC 19. The communication controller 61a may include an electronic component and a conductor pattern built in or mounted on the FPC 19.

The communication controller 61a receives an analog signal through the antenna 61b, and converts the analog signal into a digital signal and outputs the digital signal to the preamplifier 62, for example. Furthermore, the communication controller 61a receives and converts a digital signal from the preamplifier 62 into an analog signal and outputs the analog signal from the antenna 61b as radio waves.

As illustrated in FIG. 5, the antenna 61b according to the first embodiment is, for example, a chip antenna. The antenna 61b is mounted on the opposing part of the outer surface 19a of the FPC 19 with respect to the inner surface 75a of the relay board 75. The antenna 61b may be set at another position or may be united with the communication controller 61a.

The external communication device 56 and the internal communication device 61 in the present embodiment wirelessly communicate with each other using radio waves. In other words, the external communication device 56 uses the antenna 56b to wirelessly communicates with the internal communication device 61 through the antenna 61b.

For example, the communication controllers 56a and 61a of the external communication device 56 and the internal communication device 61 convert and generate signals in compliance with a common communication system. The antennas 56b and 61b of the external communication device 56 and the internal communication device 61 have substantially the same resonance frequency. The communication controllers 56a and 61a and the antennas 56b and 61b are not limited to this example.

In the present embodiment, the external communication device 56 and the internal communication device 61 wirelessly communicate with each other by, for example, a wireless LAN, Wi-Fi (registered trademark), Bluetooth (registered trademark), near field communication (NFC), transfer jet (registered trademark), a fifth generation mobile communication system (5G), or other communication systems. The external communication device 56 and the internal communication device 61 perform, for example, mutual authentication or pairing, and perform wireless communication using an encrypted signal.

The relay board 75 is located between the antenna 56b of the external communication device 56 and the antenna 61b of the internal communication device 61. As described above, the relay board. 75 is made of an insulator. Thus, radio waves are transmitted and received between the antenna 56b and the antenna 61b through the relay board 75. The radio waves may be transmitted and received between the antenna 56b and the antenna 61b through another part of the housing 11.

Hereinafter, an operation of the HDD 10 according to the present embodiment will be described by way of example. For example, in a write operation, the processor of the host computer 1 of FIG. 4 inputs a write command and write data to the controller 53 via the I/F connectors 1a and 52. In accordance with the write command, the RWC of the controller 53 modulates the write data into serial data and inputs the serial data to the communication controller 56a of the external communication device 56.

The communication controller 56a of FIG. 6 converts the input digital signal into an analog signal and outputs the analog signal as radio waves from the antenna 56b. The radio waves transmit through the relay board 75 and fly toward the antenna 61b inside the housing 11.

After the antenna 61b of the internal communication device 61 receives the radio waves, the communication controller 61a converts the analog signal transmitted by the radio waves into a digital signal and inputs the digital signal to the preamplifier 62. The preamplifier 62 amplifies the digital signal and outputs the amplified digital signal to the magnetic head 15. The magnetic head 15 writes the write data included in the digital signal onto the recording layer of the magnetic disk 12.

Further, the controller 53 of FIG. 4 controls various components such as the VCM 17 in accordance with the write command. For example, the servo controller 54 controls the VCM 17 under the control of the controller 53. The servo controller 54 outputs a signal to the VCM 17 through the relay connectors 55, 72, 71, and 63. The servo controller 54 may output a signal to the VCM 17 via the external communication device 56 and the internal communication device 61.

In a read operation, the processor of the host computer 1 inputs a read command to the controller 53 via the I/F connectors 1a and 52. The controller 53 causes the magnetic head 15 to read data from the recording layer of the magnetic disk 12, following the read command.

After the magnetic head. 15 reads the intended data, the preamplifier 62 amplifies the read digital signal and outputs the amplified digital signal to the communication controller 61a of the internal communication device 61. The communication controller 61a of FIG. 6 converts the input digital signal into an analog signal and outputs the analog signal as radio waves from the antenna 61b. The radio waves transmit through the relay board 75 and fly toward the antenna 56b outside the housing 11.

After the antenna 56b of the external communication device 56 receives the radio waves, the communication controller 56a converts the analog signal transmitted by the radio waves into a digital signal and inputs the digital signal to the controller 53. The RWC of the controller 53 demodulates the digital signal and outputs the read data included in the digital signal to the host computer 1 through the I/F connectors 1a and 52.

in the operation of the HDD 10 as above, the FPC 19 inside the housing 11 and the PCB 51 outside the housing 11 exchange the data through the wireless communication between the external communication device 56 and the internal communication device 61. Meanwhile, the spindle motor 13, the magnetic head 15, the VCM 17, and the FPC 19 inside the housing 11 are supplied with power through the relay connectors 55, 63, 71, and 72. Thus, the relay connectors 55, 63, 71, and 72 are provided with the pins for power supply, but the pins for data transmission/reception can be omitted.

The relay connectors 55, 63, 71, and 72 may be provided with the pins for data transmission and reception. In this case, the FPC 19 and the PCB 51 exchange data partially through the wireless communication between the external communication device 56 and the internal communication device 61, and partially through the wired communication via the relay connectors 55, 63, 71, and 72. For example, the FPC 19 and the PCB 51 may exchange a small amount of data or highly confidential data through the wired communication via the relay connectors 55, 63, 71, and 72.

in the HDD 10 according to the first embodiment described above, the FPC 19, located inside the housing 11, is equipped with the internal communication device 61. The PCB 51, located outside the housing and attached to the housing 11, is equipped with the external communication device 56. The external communication device 56 wirelessly communicates with the internal communication device 61. This eliminates the necessity for the HDD 10 to include the connector for data communication between the FPC 19 and the PCB 51. Further, in the case of the HDD 10 including the relay connectors 55, 63, 71, and 72 as in the present embodiment, the relay connectors 55, 63, 71, 72 do not require wiring or pins for data communication. The HDD 10 can be avoided from including a larger-size connector. In other words, the HDD 10 can be equipped with a smaller-size connector or can omit the connector for connecting between the FPC 19 and the PCB 51. The HDD 10 includes no larger-size connector, which can avoid leakage of a fluid from the inside to the outside of the housing 11 through the part of the housing 11 including the connector, for example.

Furthermore, the number of wires or pins of the connector is not to be increased due to the increase in the amount of communication data between the FPC 19 and the PCB 51. Layout of other parts and components is not to be limited by an increased-size connector, which results in avoiding increase in the development cost of the HDD 10.

The internal communication device 61 includes an antenna 61b. The external communication device 56 includes the antenna 56b and uses the antenna 56b to wirelessly communicate with the internal communication device 61 through the antenna 61b. That is, the internal communication device 61 and the external communication device 56 wirelessly communicate with each other using radio waves. This facilitates the wireless communication between the internal communication device 61 located inside the housing 11 and the external communication device 56 located outside the housing 11.

The housing 11 includes the relay board 75 located between the antenna 61b and the antenna 56b and including the insulator. This makes it possible to prevent the interference of the transmission and reception of the radio waves between the antenna 61b and the antenna 56b.

The housing 11 is provided with the through hole 25c through which the inside of the housing 11 communicates with outside. The relay board 75 closes the through hole 25c. Thereby, the housing 11 partially containing a conductor, such as in the base 21, can be provided with the relay board 75 including the insulator.

The wired connection 70 is included in the housing 11, to electrically connect the FPC 19 and the PCB 51. The wired connection 70 includes the relay connector 71 located on the relay board 75 and connected to the FPC 19, and the relay connector 72 located on the relay board 75 and connected to the PCB 51. That is, the relay connectors 71 and 72 can be more easily set on the relay board 75 including the insulator than on the metal part of the housing 11. Further, the antenna 61b and the antenna 56b can transmit, and receive the radio waves through the relay board 75. This eliminates the necessity for the housing 11 to include an insulating part different from the relay board 75.

The antenna 61b is an electronic component mounted on the FPC 19. This facilitates mounting of the internal communication device 61 on the FPC 19.

The wired connection 70 is included in the housing 11, to electrically connect the FPC 19 and the PCB 51. In such an HDD 10, not the wired connection 70 but the external communication device 56 and the internal communication device 61 perform the wireless communication as described above, so that the wired connection 70 (connector) can be avoided from increasing in size.

The FPC 19 is supplied with power from the PCB 51 via the wired connection 70. That is, the FPC 19 can be stably supplied with power. Further, in the HDD 10 according to the present embodiment, the wired connection 70 is provided with the wiring and pins for the power supply but with no wiring and pins for data communication. Thereby, the wired connection 70 (connector) can be avoided from increasing in size.

The housing 11 has the sealed space S inside. Such an HDD 10 is prevented from incorporating an increased-size connector, which can avoid the fluid from leaking from the inside to the outside of the housing 11 through the part including the connector, to be able to maintain the internal space S in the sealed state.

The PCB 51 includes the I/F connector 52 connected to the external host computer 1, and performs the wired communication with the host computer 1 through the I/F connector 52. Thereby, the HDD 10 can stably perform data communication with the host computer 1.

Second Embodiment

Hereinafter, a second embodiment will be described with reference to FIG. 7. In the following description of the embodiments, components having the same functions as the components already described are given the same reference numerals as the above-described components, and further description thereof may be omitted. Further, the plurality of components to which the same reference numerals are assigned do not necessarily have common functions and properties, and may have different functions and properties according to each embodiment.

Figure 7:
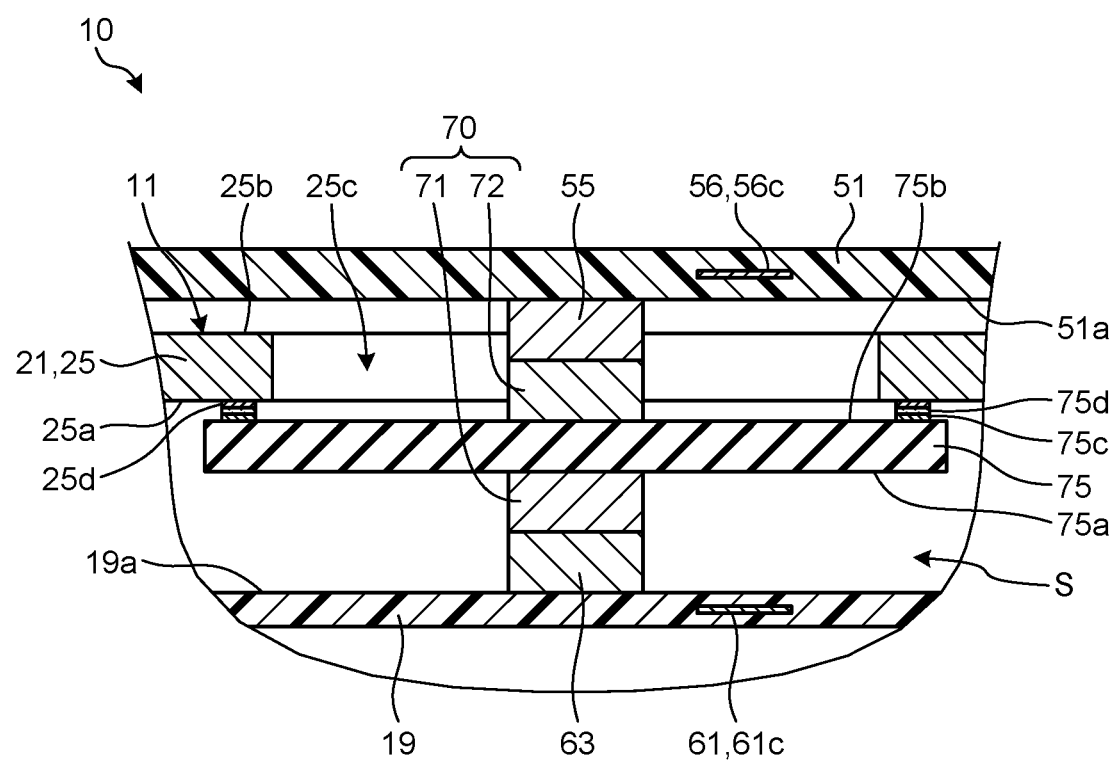
FIG. 7 is an exemplary cross-sectional view illustrating a part of an HDD according to a second embodiment.

FIG. 7 is an exemplary cross-sectional view illustrating a part of an HDD 10 according to a second embodiment. As illustrated in FIG. 7, an external communication device 56 according to the second embodiment includes an antenna 56c instead of the antenna 56b. The antenna 56c is an example of a second antenna.

The antenna 56c in the second embodiment is, for example, a pattern antenna. In other words, the antenna 56c made of a conductor pattern set on a conductor layer of a PCB 51. The antenna 56c is provided inside the PCB 51. For example, the antenna 56c is covered with an insulating layer of the PCB 51.

An internal communication device 61 according to the second embodiment includes an antenna 61c instead of the antenna 61b. The antenna 61c is an example of a first antenna. The antenna 61c in the second embodiment is, for example, a pattern antenna. In other words, the antenna 61c is made of a conductor pattern set on a conductor layer of an FPC 19. The antenna 61c is provided inside the FPC 19. For example, the antenna 61c is covered with an insulating layer of the FPC 19.

The antennas 56c and 61c are arranged in the same manner as the antennas 56b and 61b according to the first embodiment. Therefore, a relay board 75 including an insulator is located between the antenna 56c and the antenna 61c. Therefore, radio waves are transmitted and received between the antenna 56c and the antenna 61c through the relay board 75.

in the HDD 10 according to the second embodiment described above, the antenna 61c is located inside the FPC 19. This can avoid the internal communication device 61 from increasing in size. That is, the internal communication device 61 occupies less space inside the housing 11, so that the degree of freedom in layout of the components inside the housing 11 can be not subject to restriction.

Third Embodiment

Figure 8:
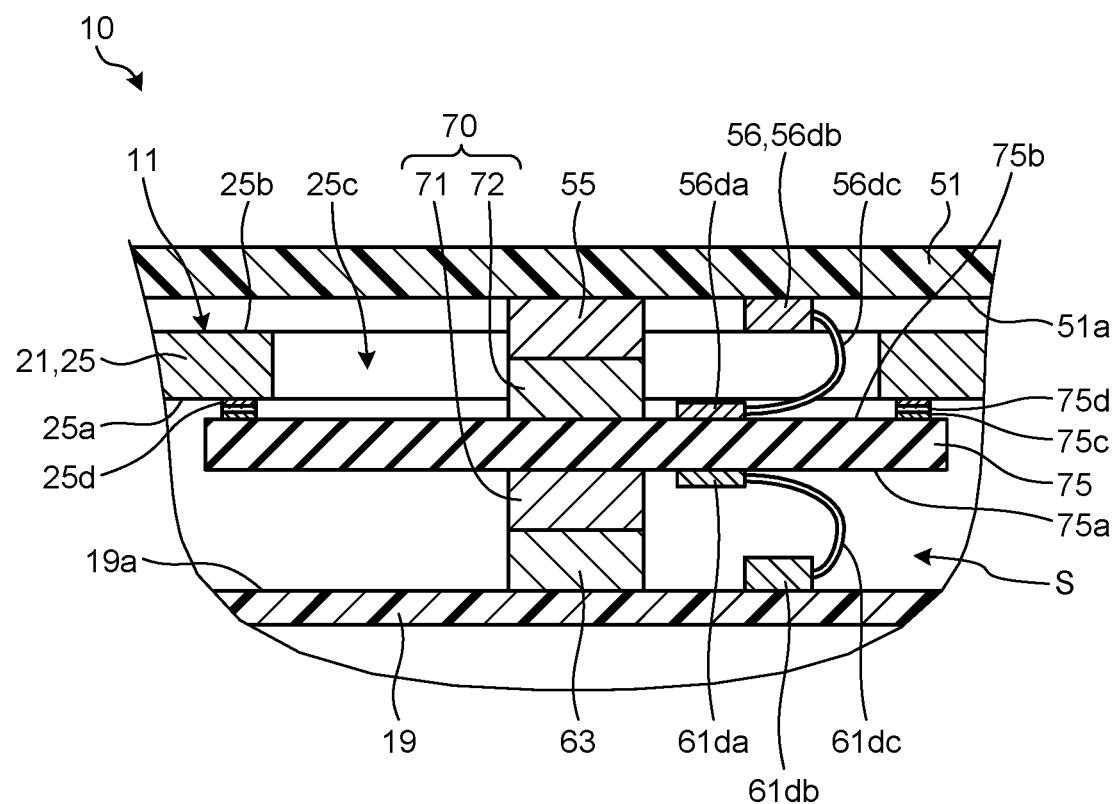
FIG. 8 is an exemplary cross-sectional view illustrating a part of an HDD according to a third embodiment.

Hereinafter, a third embodiment will be described with reference to FIG. 8. FIG. 8 is an exemplary cross-sectional view illustrating a part of an HDD 10 according to a third embodiment. As illustrated in FIG. 8, the external communication device 56 according to the second embodiment includes an antenna 56da, an antenna connector 56db, and a coaxial cable 56dc instead of the antenna 56b. The antenna 56da is an example of a second antenna.

The antenna 56da is attached to an outer surface 75b of the relay board. 75 by, for example, bonding with a double-sided tape or an adhesive, soldering with solder, snap fitting with a hook, or other means. The antenna 56da may be attached to another part of a housing 11, a PCB 51, or a relay connector 72, for example.

The antenna connector 56db is mounted on the PCB 51. The coaxial cable 56dc connects the antenna 56da and the antenna connector 56db. In other words, the coaxial cable 56dc electrically connects between the PCB 51 and the antenna 56da. As a result, the external communication device 56 is provided on the PCB 51, and the antenna 56da is arranged on the outer surface 75b of the relay board 75.

The internal communication device 61 according to the second embodiment includes an antenna 61da, an antenna connector 61db, and a coaxial cable 61dc instead of the antenna 61b. The antenna 61da is an example of a first antenna. The coaxial cable 61dc is an example of a cable.

The antenna 61da is attached to an inner surface 75a of the relay board 75 by, for example, bonding with a double-sided tape or an adhesive, soldering with solder, snap fitting with a hook, or other means. The antenna 61da may be attached to another part of a housing 11, an FPC 19, or a relay connector 71, for example.

The antenna connector 61db is mounted on the FPC 19. The coaxial cable 61dc connects the antenna 61da and the antenna connector 61db. In other words, the coaxial cable 61dc electrically connects the FPC 19 and the antenna 61da. As a result, the internal communication device 61 is provided on the FPC 19, and the antenna 61da is arranged on the inner surface 75a of the relay board 75.

A relay board 75 including an insulator is located between the antenna 56da and the antenna 61da. Radio waves are transmitted and received between the antenna 56da and the antenna 61da through the relay board 75.

In the HDD 10 according to the third embodiment described above, the antenna 61da is attached to the housing 11. The internal communication device 61 is equipped with a coaxial cable 61dc that electrically connects the FPC 19 and the antenna 61da. This improves the degree of freedom in placement of the antenna 61da.

The antenna 61da is attached to the relay board 75. This leads to shortening the distance between the antenna 61da and the antenna 56da, which enables stable, wireless communication between the internal communication device 61 and the external communication device 56.

In the first to third embodiments, the antennas 56b, 56c, and 56da of the external communication device 56 and the antennas 61b, 61c, and 61da of the internal communication device 61 are of the same type. However, the antennas 56b, 56c, and 56da of the external communication device 56 and the antennas 61b, 61c, and 61da of the internal communication device 61 may be different from each other. Further, the external communication device 56 and the internal communication device 61 may be equipped with a plurality of antennas. For example, the external communication device 56 includes at least one of the antennas 56b, 56c, and 56da, and the internal communication device 61 includes at least one of the antennas 61b, 61c, and 61da.

Fourth Embodiment

Figure 9:
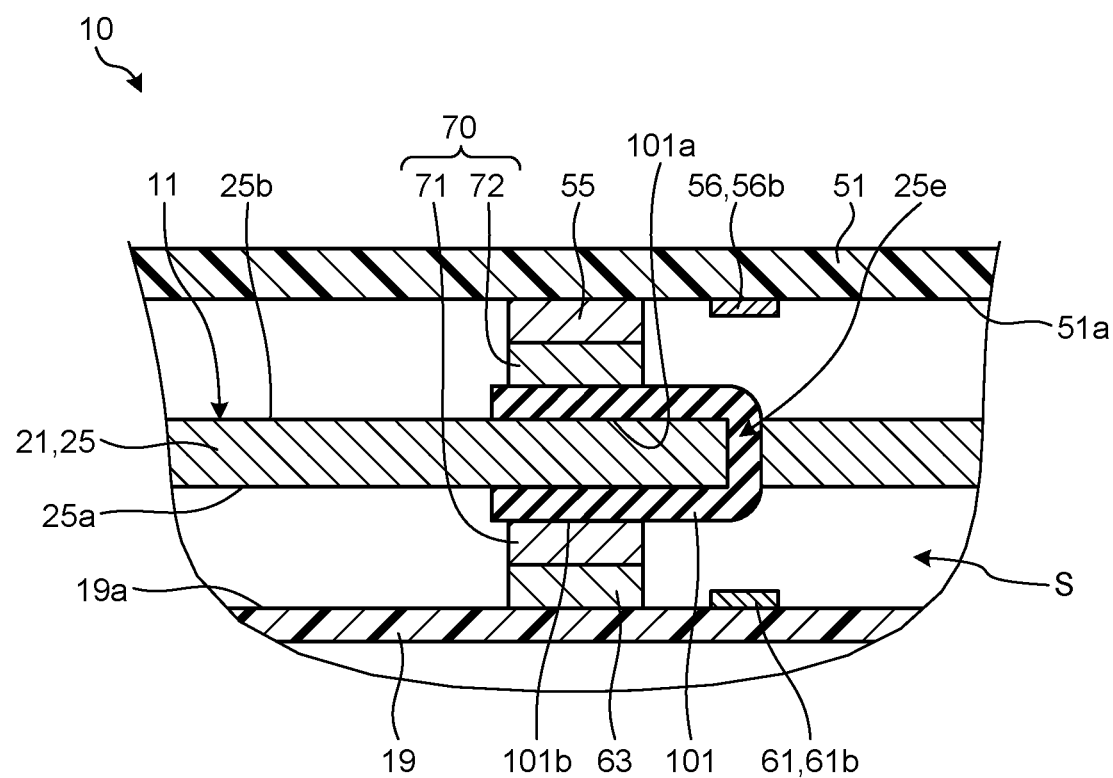
FIG. 9 is an exemplary cross-sectional view illustrating a part of an HDD according to a fourth embodiment.

Hereinafter, a fourth embodiment will be described with reference to FIG. 9, FIG. 9 is an exemplary cross-sectional view illustrating a part of an HDD 10 according to a fourth embodiment. As illustrated in FIG. 9, a housing 11 according to the fourth embodiment is equipped with a relay FPC 101 instead of the relay board 75. The relay FPC 101 is an example of a wall.

The relay FPC 101 includes for example, a lamination of a conductor layer, an insulating layer, and an adhesive layer, and is elastically deformable. The conductor layer is made of a conductive metal such as copper. The insulating layer is made of an insulating synthetic resin such as polyimide. That is, the relay FPC 101 includes an insulator.

The relay FPC 101 includes a first surface 101a and a second surface 101b. The second surface 101b is opposite the first surface 101a. The relay connectors 71 and 72 of the wired connection 70 are mounted on the relay FPC 101. In the present embodiment, the relay connectors 71 and 72 protrude from the second surface 101b separately from each other. The relay connectors 71 and 72 may protrude from the first surface 101a.

The bottom wall 25 of the housing 11 is provided with an through hole 25e instead of the through hole 25c. The through hole 25e penetrates through the bottom wall 25 and opens at an inner surface 25a and an outer surface 25b. In other words, the through hole 25e makes the inside of the housing 11 communicates with outside. The through hole 25e has a cross section having substantially the same shape as a cross section of the relay FPC 101.

The relay FPC 101 penetrates through the through hole 25e. Therefore, a part of the relay FPC 101 is located in a space S inside the housing 11, another part of the relay FPC 101 is located outside the housing 11, and another part of the relay FPC 101 is located inside the through hole 25e. A gap between the relay FPC 101 and the edge of the through hole 25e is hermetically or liquid tightly filled with, for example, a synthetic resin.

Inside the housing 11, the first surface 101a of the relay FPC 101 is fixed to the inner surface 25a of the bottom wall 25 by, for example, adhesion. Inside the housing 11, the relay connector 71 protrudes from the second surface 101b of the relay FPC 101.

Outside the housing 11, the first surface 101a of the relay FPC 101 is fixed to the outer surface 25b of the bottom wall 25 by, for example, adhesion. Outside the housing 11, the relay connector 72 protrudes from the second surface 101b of the relay FPC 101.

In the fourth embodiment, the antennas 56b and 61b are both set so as to face the through hole 25e. In other words, the antennas 56b and 61b are both set to face a part of the relay FPC 101 located inside the through hole 25e. As a result, the relay FPC 101 placed inside the through hole 25e is partially located between the antenna 56b and the antenna 61b.

In the fourth embodiment, the radio waves output from the antenna 56b transmit through a part of the relay FPC 101 located inside the through hole 25e and fly toward the antenna 61b. Similarly, the radio waves output from the antenna 61b transmit through a part of the relay FPC 101 located inside the through hole 25e and fly toward the antenna 56b.

In the HDD 10 of the fourth embodiment described above, the relay FPC 101 passes through the through hole 25e in the bottom wall 25. This enables decrease in size of the through hole 25e in the bottom wall 25, and can avoid fluid from leaking between the inside and the outside of the housing 11 from the through hole 25e.

Fifth Embodiment

Figure 10:
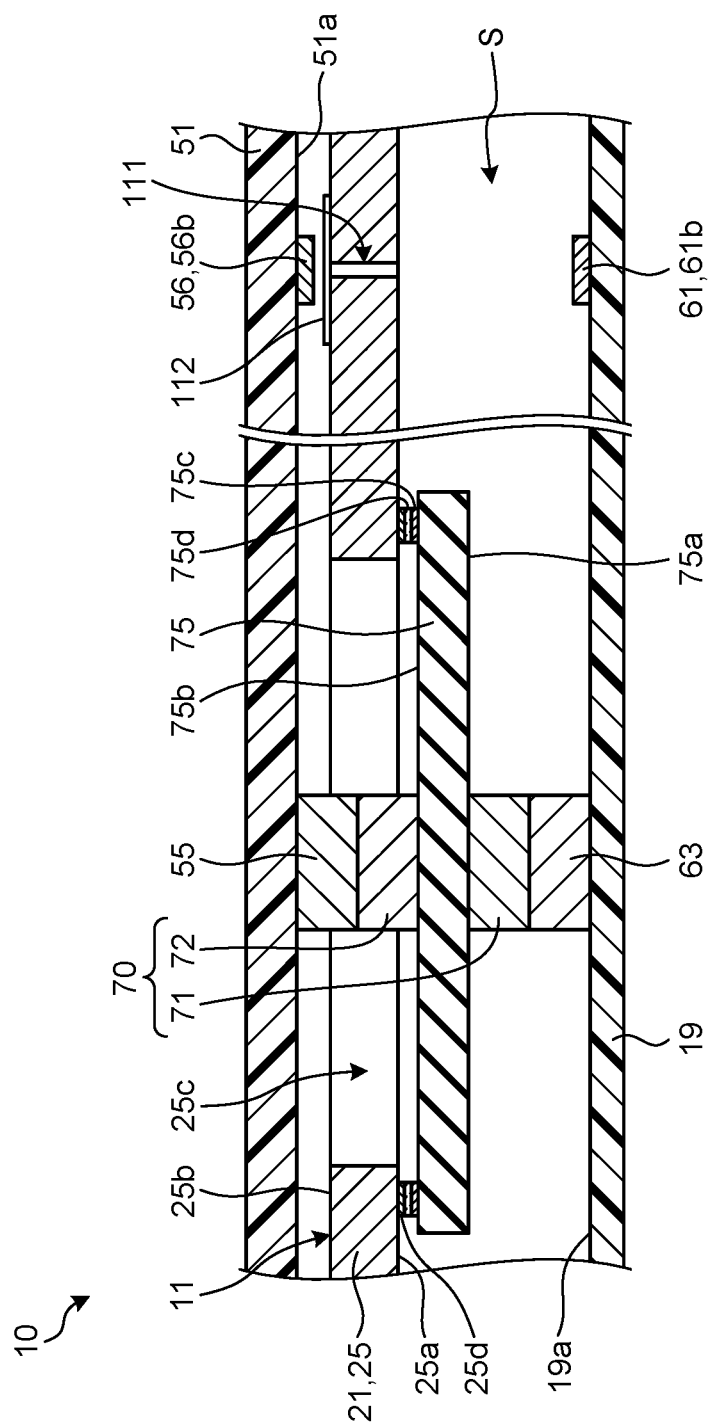
FIG. 10 is an exemplary cross-sectional view illustrating a part of an HDD according to a fifth embodiment.

Hereinafter, a fifth embodiment will be described with reference to FIG. 10. FIG. 10 is an exemplary cross-sectional view illustrating a part of an HDD 10 according to a fifth embodiment. As illustrated in FIG. 10, in the fifth embodiment, a hole 111 is provided on a bottom wall 25. The hole 111 penetrates through the bottom wall 25 and opens at an inner surface 25a and an outer surface 25b. In other words, the hole 111 serves to allow the inside of the housing 11 to communicate with outside.

The hole 111 is used as a vent hole, for example. After components are attached to an inside of a base 21 and an inner cover 22 and an outer cover 23 are attached to the base 21, air inside the housing 11 is evacuated from the hole 111. In addition, a space S inside the housing 11 is filled with a gas such as helium different from air. The hole 111 may be used for other purposes.

The hole 111 of the bottom wall 25 is closed by a seal 112. The seal 112 is an example of a wall and forms a part of the housing 11. The seal 112 is made of, for example, a synthetic resin. In other words, the seal 112 includes an insulator. The hole 111 and the seal 112 may be provided in the other portion of the housing 11.

In the fifth embodiment, the antennas 56b and 61b are both set so as to face the hole 111. In other words, the antennas 56b and 61b are both set so as to face a part of the seal 112 that closes the hole 111. As a result, at least a part of the seal 112 is located between the antenna 56b and the antenna 61b.

In the fifth embodiment, radio waves output from the antenna 56b transmits through the seal 112 and the hole 111 and fly toward the antenna 61b. Similarly, the radio waves output from the antenna 61b transmit through the hole 111 and a part of the seal 112 and fly toward the antenna 56b.

In the HDD 10 of the fifth embodiment described above, the housing 11 is provided with the hole 111 through which the inside of the housing 11 communicates with outside. The seal 112 serves to close the hole 111. Thereby, the housing 11 partially containing a conductor, such as in the base 21, can be provided with the seal 112 including the insulator as a wall. According to the present embodiment, the radio waves fly through the hole 111 for use in filling the inside of the housing 11 with the gas, which eliminates the necessity for forming another hole such as the through hole 25c. Thus, in the case of wirelessly feeding power to the FPC 19, the through hole 25c may be omissible, for example.

Sixth Embodiment

Figure 11:
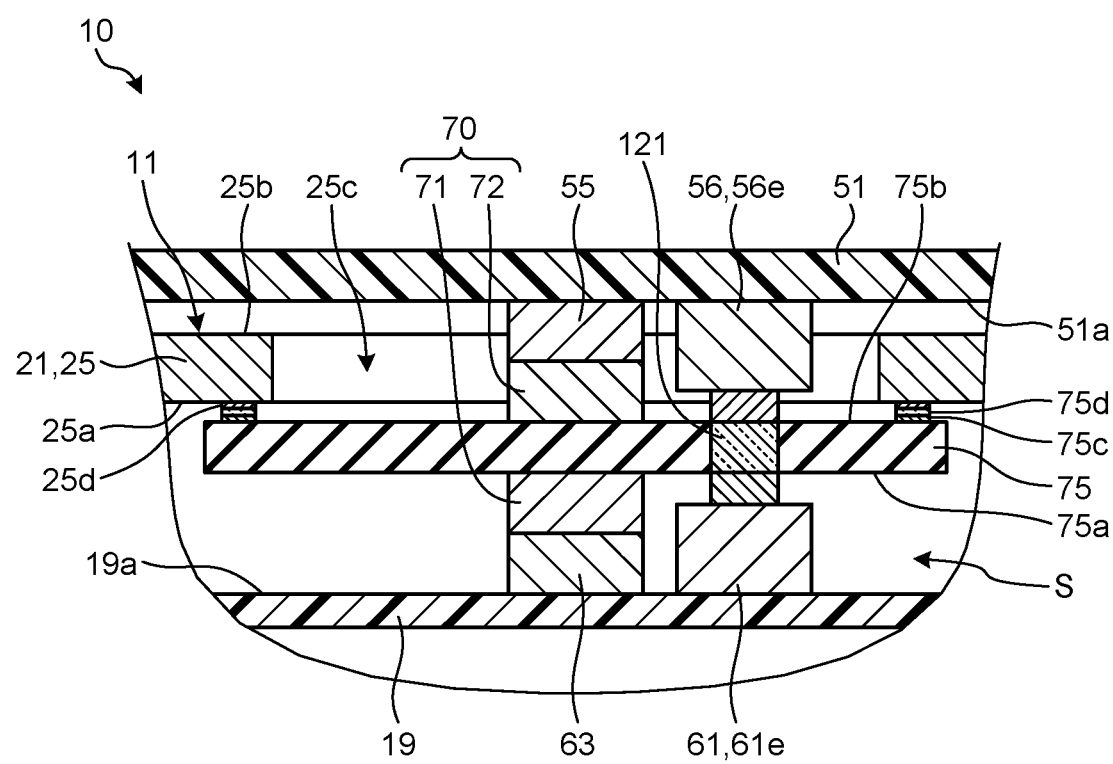
FIG. 11 is an exemplary cross-sectional view illustrating a part of an HDD according to a sixth embodiment.

Hereinafter, a sixth embodiment will be described with reference to FIG. 11. FIG. 11 is an exemplary cross-sectional view illustrating a part of an HDD 10 according to the sixth embodiment. As illustrated in FIG. 11, an external communication device 56 according to the sixth embodiment includes an optical communication device 56e instead of the antenna 56b. The optical communication device 56e is an example of a first optical wireless communication unit and a second optical wireless communication unit.

An internal communication device 61 according to the sixth embodiment includes an optical communication device 61e instead of the antenna 61b. The optical communication device 61e is an example of a first optical wireless communication unit and a second optical wireless communication unit.

The optical communication devices 56e and 61e each have a light emitting element and a light receiving element. The light emitting element is, for example, a light emitting diode (LED), and emits light based on an electric signal input to the optical communication device 56e. Examples of light include visible light, infrared light, and ultraviolet light. The light receiving element is, for example, a photodiode, receives light, and outputs an electric signal according to the intensity of the received light.

In the sixth embodiment, a communication controller 56a of the external communication device 56 demodulates the electric signal output from the light receiving element of the optical communication device 56e as a digital signal and outputs the digital signal to the controller 53. Further, the communication controller 56a modulates the digital signal input from the controller 53, and causes the light emitting element of the optical communication device 56e to emit light by the signal.

The communication controller 61a of the internal communication device 61 demodulates the electric signal output from the light receiving element of the optical communication device 61e as the digital signal, and outputs the electric signal to the preamplifier 62, for example. Further, the communication controller 61a modulates the digital signal input from the preamplifier 62, and causes the light emitting element of the optical communication device 61e to emit light by the signal.

In the sixth embodiment, a relay board 75 is provided with an optical guide 121. The optical guide 121 is, for example, a transparent part or a part through which light can transmit. The relay board 75 may be entirely the optical guide 121. The optical guide 121 may be a light transmitting component, such as an optical fiber, that is included in the relay board 75. The optical guide 121 is not limited to the relay board 75, and may be located in another part of the housing 11 such as the bottom wall 25.

The optical communication device 56e is mounted on a portion of the inner surface 51a of the PCB 51 that faces the optical guide 121. The optical communication device 61e is mounted on a portion of an outer surface 19a of the FPC 19 that faces the optical guide 121. The light emitting element of the optical communication device 56e and the light receiving element of the optical communication device 61e face each other through the optical guide 121. Furthermore, the light receiving element of the optical communication device 56e and the light emitting element of the optical communication device 61e face each other through the optical guide 121.

The external communication device 56 and the internal communication device 61 in the present embodiment communicate with each other by wireless communication. In other words, the external communication device 56 wirelessly communicates with the internal communication device 61 through the optical communication devices 56e and 61e.

in the HDD 10 of the sixth embodiment described above, the internal communication device 61 and the external communication device 56 include the optical communication device 61e that emits light and the optical communication device 56e that receives light, respectively. The external communication device 56 wirelessly communicates with the internal communication device 61 through the optical communication device 61e and the optical communication device 56e. This leads to improving the confidentiality of communication between the internal communication device 61 and the external communication device 56, as compared with the communication via radio waves.

As described above, the external communication device 56 and the internal communication device 61 may perform wireless communication using the radio waves as in the first to fifth embodiments, or may perform wireless communication using light as in the sixth embodiment. That is, the wireless communication includes wireless communication using radio waves and optical wireless communication using light.

The first to sixth embodiments have described the example that the FPC 19 is placed inside the housing 11 and supplied with power via wiring through the wired connection 70. However, power may be supplied to the FPC 19 by wireless power feeding.

Furthermore, the above embodiments have described the example that the external communication device 56 and the internal communication device 61 perform bidirectional wireless communication. However, the external communication device 56 and the internal communication device 61 may perform one-way wireless communication. For example, the internal communication device 61 may perform one-way wireless communication with the external communication device 56, and the HDD 10 may be used as a read only storage device.

According to at least one of the embodiments described above, a first substrate is located inside the housing and includes the first wireless communication device. A second substrate is located outside the housing, attached to the housing, and includes a second wireless communication device. The second wireless communication device wirelessly communicates with the first wireless communication device. Such an arrangement can eliminate the necessity for the electronic device to include a connector for data communication between the first board and the second board. Further, in the case of an electronic device equipped with a connector, the connector does not require wiring or pins for data communication. That is, the electronic device can be avoided from including a larger-size connector. Not incorporating a larger-size connector can avoid, for example, a fluid from leaking from the inside to the outside of the housing through the part including the connector. Furthermore, the number of wires or pins of the connector is not to increase due to the increase in the amount of communication data between the first substrate and the second substrate. The layout of other parts and components is not subject to a limitation by a larger-size connector, preventing increase in the development cost of the electronic device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device, comprising:
a housing;
a first substrate that is located inside the housing;
a second substrate that is located outside the housing and attached to the housing;
a first wireless communication device that is included in the first substrate; and
a second wireless communication device that is included in the second substrate and wirelessly communicates with the first wireless communication device, wherein
the first wireless communication device includes a first antenna,
the second wireless communication device includes a second antenna,
the housing has a wall located between the first antenna and the second antenna, the wall including an insulator, and
the first wireless communication device and the second wireless communication device transmit and receive a radio wave between the first antenna and the second antenna through the wall to wirelessly communicate with each other.

2. The electronic device according to claim 1, wherein
the housing is provided with a hole through which an inside of the housing communicates with an outside, and
the wall closes the hole.

3. The electronic device according to claim 1, wherein
the housing includes a metal wall and a connection,
the metal wall is provided with a hole through which an inside of the housing communicates with an outside,
the wall includes a third substrate that is located between the first antenna and the second antenna, the third substrate including an insulator and closing the hole,
the connection includes:
a first connector that is set on the third substrate and connected to the first substrate, and
a second connector that is set on the third substrate, connected to the second substrate, and electrically connected with the first connector, and
the first wireless communication device and the second wireless communication device transmit and receive a radio wave between the first antenna and the second antenna through the third substrate to wirelessly communicate with each other.

4. The electronic device according to claim 1, wherein the first antenna is set inside the first substrate.

5. The electronic device according to claim 1, wherein the first antenna is mounted on the first substrate.

6. The electronic device according to claim 1, wherein
the first antenna is attached to the housing, and
the first wireless communication device includes a cable that electrically connects between the first substrate and the first antenna.

7. An electronic device, comprising:
a housing;
a first substrate that is located inside the housing;
a second substrate that is located outside the housing and attached to the housing;
a first wireless communication device that is included in the first substrate; and
a second wireless communication device that is included in the second substrate and wirelessly communicates with the first wireless communication device, wherein
one of the first wireless communication device and the second wireless communication device includes a first optical wireless communication unit that emits light,
the other of the first wireless communication device and the second wireless communication device includes a second optical wireless communication unit that receives the light, and
the second wireless communication device wirelessly communicates with the first wireless communication device through the first optical wireless communication unit and the second optical wireless communication unit.

8. The electronic device according to claim 7, further comprising: a connection that is included in the housing and electrically connects the first substrate and the second substrate.

9. The electronic device according to claim 3, wherein the first substrate is supplied with power from the second substrate via the connection.

10. The electronic device according to claim 1, wherein
the housing has a hermetically or liquid-tightly sealed space inside, and
the first substrate is located in the space.

11. The electronic device according to claim 1, wherein
the second substrate includes an external connector that is connected to an external device, and
the second substrate communicates with the external device through the external connector in a wired manner.

12. The electronic device according to claim 7, wherein
the housing has a hermetically or liquid-tightly sealed space inside, and
the first substrate is located in the space.

13. The electronic device according to claim 7, wherein
the second substrate includes an external connector that is connected to an external device, and
the second substrate communicates with the external device through the external connector in a wired manner.

\* \* \* \* \*